United States Patent [19]

Hara et al.

[11] Patent Number: 5,552,639
[45] Date of Patent: *Sep. 3, 1996

[54] RESIN MOLDED TYPE SEMICONDUCTOR DEVICE HAVING A CONDUCTOR FILM

[75] Inventors: Yuji Hara, Akishima; Satoru Ito; Tatsuro Toya, both of Tokyo, all of Japan

[73] Assignee: Hitachi, Ltd., Tokyo, Japan

[*] Notice: The term of this patent shall not extend beyond the expiration date of Pat. No. 4,625,227.

[21] Appl. No.: 456,384

[22] Filed: Jun. 1, 1995

Related U.S. Application Data

[63] Continuation of Ser. No. 293,559, Aug. 22, 1994, which is a continuation of Ser. No. 72,405, Jun. 7, 1993, Pat. No. 5,371,411, which is a continuation of Ser. No. 703,765, May 21, 1991, Pat. No. 5,229,642, which is a division of Ser. No. 419,007, Oct. 10, 1989, Pat. No. 5,023,699, which is a continuation of Ser. No. 191,080, May 6, 1988, abandoned, which is a continuation of Ser. No. 744,151, Jun. 13, 1985, Pat. No. 4,625,227, which is a continuation of Ser. No. 292,585, Aug. 13, 1981, abandoned.

[30] Foreign Application Priority Data

Sep. 1, 1980 [JP] Japan .................. 55-119817

[51] Int. Cl.⁶ .............. H01L 27/02; H01L 29/34; H01L 23/48; H01L 29/44
[52] U.S. Cl. .......... 257/775; 257/207; 257/637; 257/642; 257/691; 257/739; 257/787
[58] Field of Search ................ 257/775, 787, 257/739, 691, 642, 637, 207

[56] References Cited

U.S. PATENT DOCUMENTS

| | | | |
|---|---|---|---|
| 3,538,398 | 11/1970 | Whiting | 257/488 |
| 3,675,092 | 7/1972 | Naomoto et al. | 257/488 |
| 3,766,448 | 10/1973 | Luce | 257/488 |
| 3,798,512 | 3/1974 | Critchlow et al. | 257/405 |
| 3,906,539 | 9/1975 | Sauermann et al. | 257/488 |
| 3,911,473 | 10/1975 | Niemhaus | 257/495 |
| 4,157,563 | 7/1979 | Bosselagr | 257/489 |
| 4,219,827 | 8/1980 | Kaoser | 257/779 |
| 4,236,832 | 12/1980 | Komatsu et al. | 257/420 |
| 4,242,698 | 12/1980 | Ghate et al. | 257/774 |
| 4,263,606 | 4/1981 | Yaomikane | 257/763 |
| 4,271,582 | 7/1981 | Shirai et al. | 257/640 |
| 4,365,264 | 12/1982 | Makai et al. | 257/640 |
| 4,412,237 | 10/1983 | Matsumura et al. | 257/369 |
| 4,453,174 | 7/1984 | Kawasaki et al. | 257/420 |

FOREIGN PATENT DOCUMENTS

| | | |
|---|---|---|
| 52-104062 | 9/1977 | Japan . |
| 52-104063 | 9/1977 | Japan . |
| 53-71584 | 6/1978 | Japan . |
| 53-89688 | 8/1978 | Japan . |
| 54-133090 | 10/1979 | Japan . |
| 55-29572 | 2/1980 | Japan . |
| 63-211648 | 9/1988 | Japan . |

OTHER PUBLICATIONS

ISSCC 78/Session IX: Static and Nonvolatile Memories A 4K Static Bipolar TTL RAM; K Okada et al. pp. 100–102.
IIL–Device, Video–Tape Player and TV Set (Example 2); Y. Nakano et al. pp. 1–11.

Primary Examiner—J. Carroll
Attorney, Agent, or Firm—Antonelli, Terry, Stout & Kraus

[57] ABSTRACT

A resin molded type semiconductor device has a metallic guard ring that is formed to cover the peripheral edge of the surface of a tetragonal semiconductor substrate. In order to prevent a passivation film on the guard ring from being cracked by stresses due to a resin mold package concentrating in the four corners of the semiconductor substrate, slits or rows of small holes are formed in the corner portions of the guard ring.

7 Claims, 5 Drawing Sheets

RESIN MOLDED TYPE SEMICONDUCTOR DEVICE HAVING A CONDUCTOR FILM

CROSS-REFERENCE TO RELATED APPLICATION

This application is a continuation application of Ser. No. 08/293,559, filed Aug. 2, 1994, which application is a continuation application of Ser. No.08/072,405, filed Jun. 7, 1993 (now U.S. Pat. No. 5,371,411) which application is a continuation application of Ser. No. 07/703,765, filed on May 21, 1991 (now U.S. Pat. No. 5,229,642), which application is a divisional application of Ser. No. 07/419,007, filed on Oct. 10, 1989 (now U.S. Pat. No. 5,023,699), which application is a continuation application of Ser. No. 07/191,080, filed on May 6, 1988 (now abandoned), which application is a continuation of Ser. No. 06/902,539, filed on Sep. 2, 1986 (now abandoned), which application is a continuation application of Ser. No. 06/744,151, filed on Jun. 13, 1985 (now U.S. Pat. No. 4,625,227), which application is a continuation application of Ser. No. 06/292,585, filed Aug. 13, 1981 (now abandoned).

This invention relates to a resin molded type semiconductor device, and more particularly to a guard ring structure which is formed on a semiconductor substrate.

It has been well known that an insulating film is formed on the surface of the peripheral edge of a silicon semiconductor substrate (chip) formed with one or more circuit elements, and that a conductive guard ring is disposed on the insulating film in a manner to extend along the peripheral edge of the semiconductor substrate. Such structure is disclosed in, for example, West German Patent Laid Open Print (Offenlegungsschrift) 30 02 740. The guard ring is used for preventing an inversion layer in the semiconductor substrate surface on which the insulating film is formed. It can also be used as wiring for applying the ground potential (reference potential) or power source potential of a circuit.

In order to reduce the manufacturing cost of a discrete semiconductor device or a semiconductor integrated circuit device, it is proposed to use a resin mold package instead of a ceramic package or glass package as a sealing structure for the device. To the end of the reduction of the manufacturing cost, accordingly, the semiconductor substrate having the aforecited guard ring structure is also requested to be sealed in the resin mold package.

The inventors' experiments and researches, however, have revealed that in case where the semiconductor substrate having the guard ring structure is molded with a resin by the well-known transfer mold technique, high stresses ascribable to the molding resin act especially on the four corners of a tetragonal semiconductor substrate (chip), resulting in cracks in a passivation film which overlies the guard ring at the corners of the chip and the semiconductor substrate near the corners. The cracks give rise to non-conforming articles of the semiconductor device, or form a cause for degradations in the characteristics of the semiconductor device. By way of example, the inventors studied the problem on a large-scale integrated circuit device (LSI) shown in FIGS. 1 and 2. In a chip 100, in FIGS. 1 and 2, semiconductor element regions 2, constituting active regions are formed in one major surface of a silicon semiconductor substrate 1. On an insulating film 3, overlying the surface of the peripheral edge of the substrate, wirings 4, and bonding pads 5, which are made of an aluminum film are formed and are surrounded with a guard ring 6, for preventing an inversion layer. The guard ring 6, is connected to the substrate 1 (ground line). A passivation film (final passivation film) 7, of phosphosilicate glass (PSG) or silicon nitride is formed on the surface of the chip in a manner to expose the pad portions 5. It has been revealed that, in case where the chip 100, is molded with a resin, high stresses attributed to the molding resin act especially on the four corners of the peripheral edge of the chip, so the passivation film 7, cracks on and around the guard ring 6.

The semiconductor device of such structure was subjected to a moisture-resistance test in a high-temperature and high-humidity atmosphere. As a result, the following has been revealed. In case of using a PSG (phosphorus oxide-containing silicate glass) film as the inter-layer insulating film which underlies the aluminum wiring, moisture invades the device through the cracks having appeared in the final passivation film. Thus, phosphorus in the PSG film liquates out and corrodes the aluminum wiring overlying this PSG film. The corrosion of the aluminum wiring reaches the active region of the chip, resulting in the occurrence of a defective unit of the chip or degradations of the characteristics thereof.

It is, accordingly, an object of this invention to improve the inferior characteristics and enhance the moisture resistance of a resin molded type semiconductor device having a guard ring.

As the result of experiments and research, the inventors have found out that such defects as cracks in the passivation film existing on and around the guard ring at the corner parts of the chip, as heretofore described, are dependent on the effective width of the guard ring. The reason therefor is considered as follows. When the chip is molded with the resin by the transfer mold technique, the temperature of the molding resin material is lowered from a high temperature to a normal room temperature, or when the finished semiconductor product in the resin mold package is operated, the chip generates heat, so that the corner parts of the chip undergo high stresses on account of the expansion and shrinkage of the molding resin. The stresses displace or expand and shrink the guard ring of aluminum. Due to the displacements of the aluminum guard ring, cracks appear in the final passivation film or the passivation film underlying the guard ring. It is, accordingly, considered that, in order to reduce the stresses which the aluminum guard ring at the corner parts exerts on the passivation films nearby, the effective width of the guard ring at the chip corner parts should be made small, i.e., the exposed area of the guard ring is reduced.

The present invention has been made with these findings in mind.

According to one aspect of this invention, a metallic guard ring formed along the peripheral edge of one major surface of a tetragonal semiconductor substrate is provided with slits or a plurality of arrayed holes at the corner parts of the substrate in order to reduce selectively the exposed area of the guard ring and thereby reduce the effective width of the ring.

Hereunder, this invention will be described with reference to the drawings.

Figure 1:
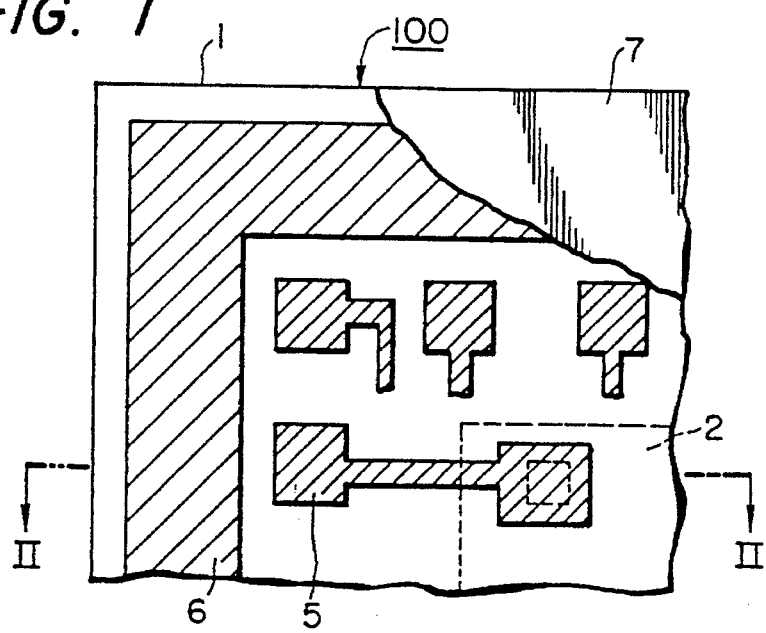
FIG. 1 is a plan view of a semiconductor device having a prior art guard ring configuration as was used in the experimental researches of this invention.
Figure 2:
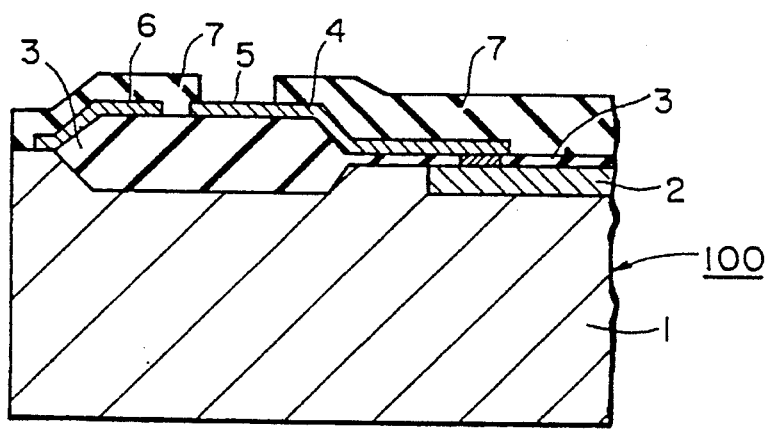
FIG. 2 is a sectional view of the semiconductor device of FIG. 1 taken along line II—II indicated in FIG. 1.
Figure 3:
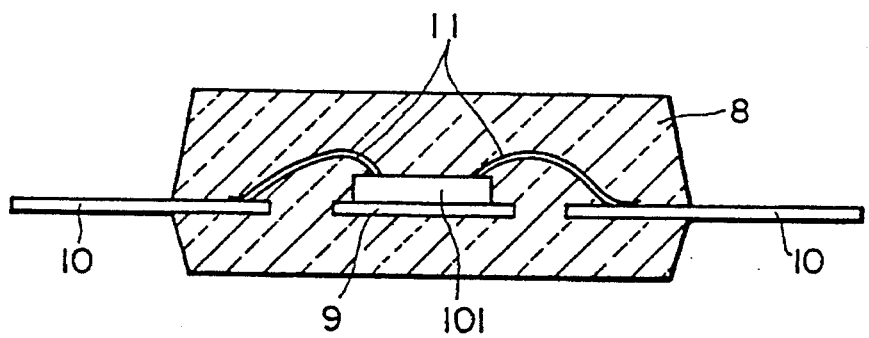
FIG. 3 is a sectional view showing the finished body of a semiconductor device according to this invention.

FIGS. 3–6 are views illustrating a preferred embodiment of this invention. FIG. 3 shows a semiconductor device including a resin mold package fabricated in accordance with this invention. In the figure, numeral 8 designates a sealing member of a resin formed by the well-known transfer mold technique. The resinous sealing member 8, seals a tetragonal silicon chip 101, a metallic lead 9, having a holding portion to which the chip 101, is fastened, parts of a plurality of metallic external leads 10, and connector wires 11, electrically connected between the chip 101, and the respective external leads 10. The resin member may be formed of thermosetting resin such as epoxy resin or thermoplastic resin.

Figure 4:
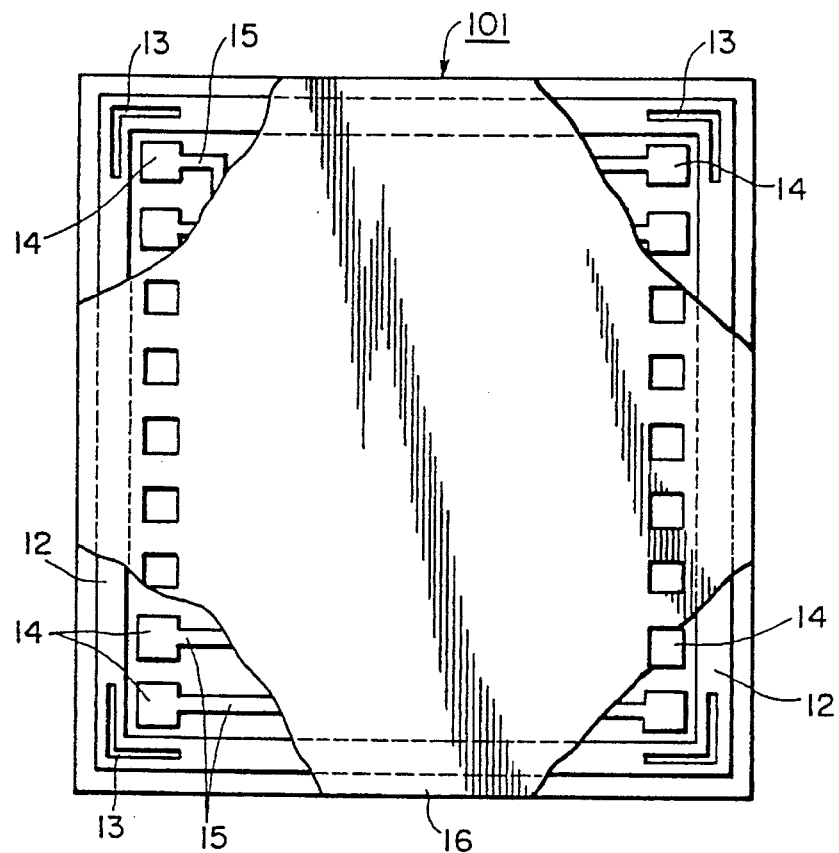
FIG. 4 is a fragmentary plan view showing the chip of the semiconductor device of FIG. 3.

FIG. 4 shows a plan view of the chip 101. The chip 101, is made of a semiconductor substrate of single-crystal silicon, in which active regions of circuit elements such as source regions and drain regions are formed by the well-known impurity diffusion technique. This embodiment illustrates the case of a MOS IC (Metal-Oxide-Semiconductor Integrated Circuit) where logic circuits constructed of MOS FETs are formed in the shape of an integrated circuit. In FIG. 4, numeral 12 designates a guard ring of aluminum which is formed on an insulating film on the silicon semiconductor substrate. The guard ring 12, is used as an inversion preventive guard ring for checking the formation of an inversion layer in the surface of the silicon semiconductor substrate, and is also used as ground wiring for the logic circuits. The outside terminating part of the guard ring 12, is electrically connected with the silicon semiconductor substrate. The four corner parts of the guard zing 12, are, respectively, formed with L-shaped slits 13, in accordance with this invention. The slits 13 will be described in detail later. Bonding pads 14, for bonding the wire connectors 11, (FIG. 3) are formed along the inner sides of the guard ring 12. Wirings or wire leads 15 extend from the respective bonding pads 14, to the active regions. The wirings 15, are covered with a final passivation film 16. The final passivation film 16, has openings for exposing the bonding areas of the bonding pads 14. The connector wires 11, are connected to the bonding areas.

Figure 5:
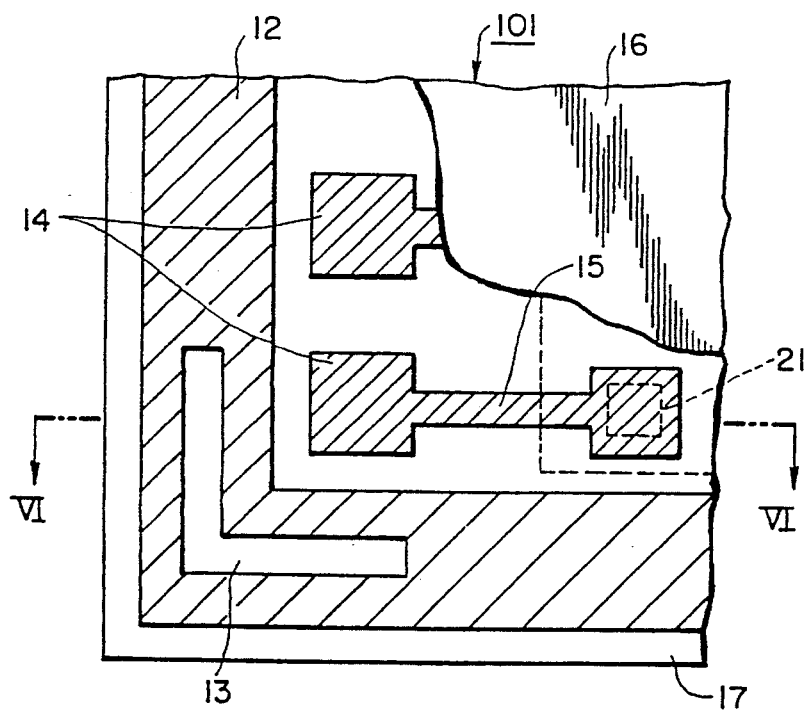
FIG. 5 is an enlarged partial plan view of the chip shown in FIG. 4.
Figure 6:
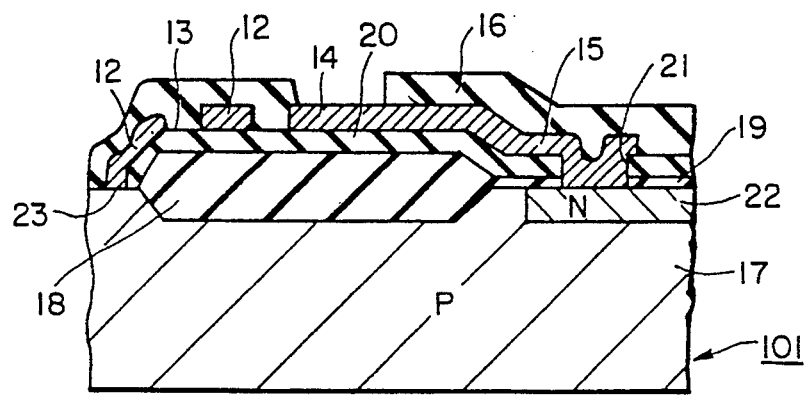
FIG. 6 is a sectional view of the semiconductor device of FIG. 5 taken along line VI—VI indicated in FIG. 5.

FIGS. 5 and 6 are an enlarged partial plan view of the chip 101, shown in FIG. 4 and a corresponding sectional view of FIG. 6, the chip 101, includes a thick silicon-oxide ($SiO_2$) film (field insulating film) 18, which is formed in one major surface of the silicon semiconductor substrate 17, and a thin silicon-oxide ($SiO_2$) film 19, which covers the regions forming the circuit elements. The technique of forming a thick oxide film on selected parts of a single silicon semiconductor substrate except regions to form elements is well known from, for example, a literature "Phillips Research Reports, Vol. 26, No. 3, pp. 157–165, June 1971". The embodiment is the MOS IC of the so-called LOCOS (Local Oxidation of Silicon) type described in the literature. The thin oxide film 19, formed on the element regions is used as the gate oxide films of the MOS FETs constituting the MOS IC. Although not shown in the drawings, gate electrodes of polycrystalline silicon are formed directly on parts of the thin oxide film 19, thereby, to form the MOS FETS. A phosphosilicate glass (PSG) (phosphorus oxide-containing silicate glass) film 20, is formed in a manner to cover the silicon gate electrodes and those parts of the field oxide film 18, and the thin oxide film 19, on which the silicon gate electrodes are not formed. The PSG film 20, serves as a getter for impurities such as sodium ions entering from the exterior, and is necessary for stabilizing the electrical characteristics of the surface of the silicon semiconductor substrate of the semiconductor device. On the PSG film 20, there are formed the foregoing guard ring 12, bonding pads 14, and wirings 15, all of which are made of aluminum. These can be simultaneously formed in such a way that a film of aluminum having a thickness of 1 μm is formed on the entire surface of the chip by the well-known evaporation technique and that the film is patterned by the etching technique. The aluminum wirings 15, lie in ohmic contact with semiconductor regions 22, being some of the element regions, via through-holes 21, formed in the PSG film 20, and the $SiO_2$ film 19. The aluminum guard ring 12, lies in ohmic contact with the silicon semiconductor substrate 17, at its outer terminating part 23. Thus, the potential of the guard ring 12, is made identical to that of the substrate 17. Since, in the embodiment, the guard ring is especially used as the ground line of the circuitry, the ohmic contact part 23, forms a current path for supplying current to the lead 9, (FIG. 3) which is connected to the rear major surface of the semiconductor substrate 17. In the corner parts of the guard ring corresponding to the corners of the chip, the L-shaped slits 13, are formed along the corners and centrally of the guard ring. The final passivation film 16, is made up of one layer among a PSG film, a silicon oxide ($SiO_2$) film formed by the well-known CVD (Chemical Vapor Deposition) process and a silicon nitride film formed by the well-known plasma process (hereinbelow, simply terms the "P-SiN film"), or a multilayer structure consisting of at least two of the films. Examples of the present embodiment adopted for the final passivation are of two sorts, i.e., a two-layer structure which consisted of a PSG film as a first layer (lower layer) and a P-SiN layer formed thereon, and a three-layer structure which consisted of a PSG film as a first layer, a P-SiN film as an intermediate layer and a PSG film as a third layer.

In the examples, the size of the chip was 4.7 mm×4.7 mm. The width of the guard ring was made to be at least 100 μm in order to prevent the increase of the resistance of the aluminum film as a wiring connection, while the width of the slit was set at approximately 10 μm in order to prevent the increase of the resistance of the guard ring at the corner part.

According to such structure, the guard ring is provided with the slits, and hence, the occurrence of the cracks in the passivation film can be prevented for the following reason.

Figure 7:
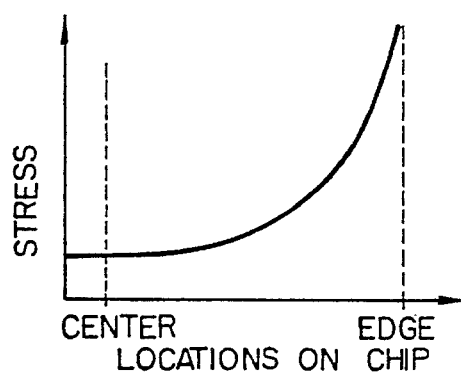
FIG. 7 is a graph showing the distribution state of stresses which arise in a chip plane due to a molding resin.

Regarding the fact that the guard ring on the peripheral part of the resin-molded semiconductor chip causes the cracks, etc., of the passivation film stresses tend to concentrate in the edge of the chip more than the center thereof as shown in FIG. 7, especially in the corners of the tetragonal chip. On the other hand, it has been experimentally confirmed that the tendency is more pronounced as the effective width of the aluminum film of the guard ring is greater. It has also been confirmed by various experiments that when the slits are formed at the corner parts of the guard ring, the effective width of the guard ring decreases by the width of the slits, whereby the stresses at the corner parts are reduced, with the result that the cause for the occurrence of the cracks is eliminated.

With the structure described above, accordingly, the displacements of the aluminum guard ring at the corner parts to be induced by the molding resin are reduced owing to the slits, and the reduced displacements do not exert high stresses on the passivation films which lie in contact with the aluminum film and which are less displaced than the metal. Therefore, the passivation films are not cracked.

Further, it has been confirmed that the occurrence of the cracks can be prevented independent of any thickness of the guard ring in the range from about 0.8 μm to about 4 μm.

Figure 8:
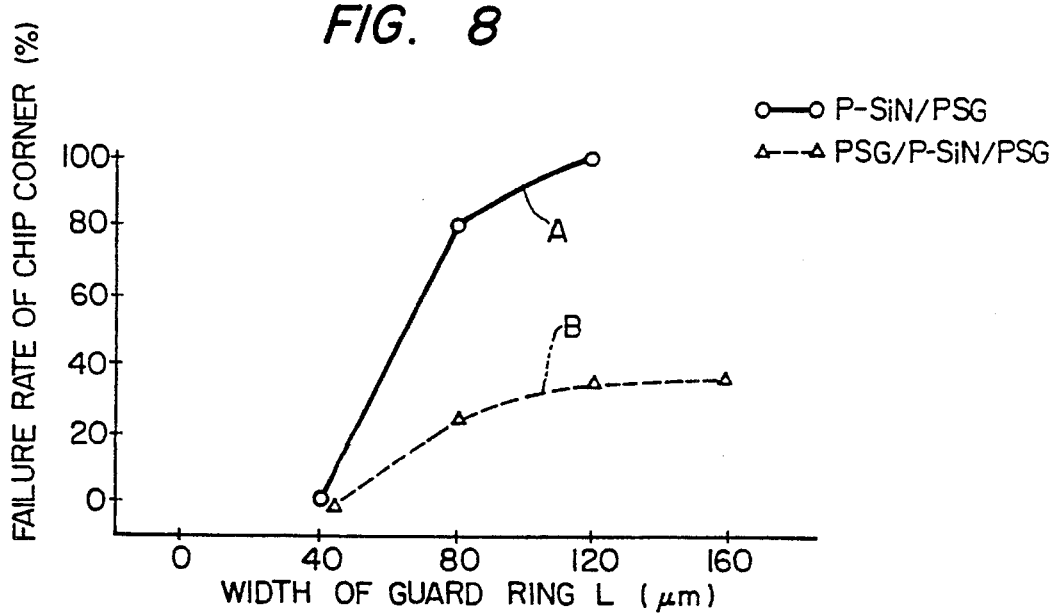
FIG. 8 is a graph showing the relationships between the effective with (or exposed area) of an aluminum guard ring and cracks which appear at the corner parts of a passivation film.
Figure 9:
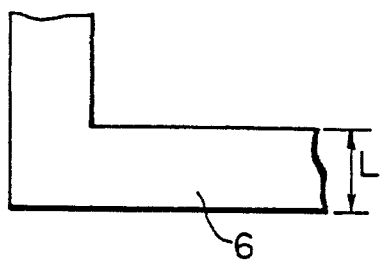
FIG. 9 is a schematic plan view showing the shape of a guard ring at a corner part in order to explain the graph of FIG. 8.

In order to facilitate understanding of the effect of this invention, the relationship between the rate of occurrence of the cracks of the passivation film and the width L of the guard ring was experimentally found by employing the shape of the prior art guard ring of aluminum as shown in FIG. 9. FIG. 8 illustrates this relationship, in which the percentage of samples having undergone the cracks is taken on the axis of ordinates as the failure rate of chip corners and the width L (FIG. 9) of the guard ring is taken on the axis of abscissa. In this case, the chip size was 4.7 mm×4.7 mm. As the final passivation films, the two sorts of the three-layer structure of PSG/P-SiN/PSG and the two-layer structure of P-SiN/PSG were used. The thicknesses of the passivation films were PSG/P-SiN/PSG=0.85 μm/1.1 μm/0.2 μm and P-SIN/PSG=1.1 μm/0.2 μm. As temperature cycles, a temperature change of from −55° C. to +150° C. was repeated 20 times. Thus, the stresses to occur the expansion and shrinkage of the resin package based on the temperature changes were acceleratedly applied to the chip corners. In FIG. 8, a curve A corresponds to the passivation film of P-SiN/PSG, while a curve B the passivation film of PSG/P-SiN/PSG. As understood from FIG. 8, the failure rate is smaller as the width L of the guard ring is smaller. That is, the stresses to be exerted from the resinous sealing member on the chip are higher as the effective width of the guard ring is greater.

Figure 11:
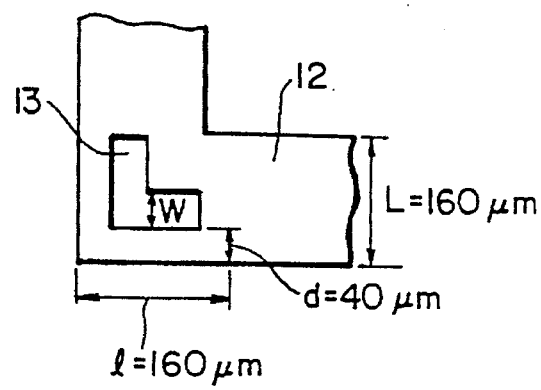
FIG. 11 is a schematic plan view showing the shape of a guard ring at a corner part in order to explain the graph of FIG. 10.
Figure 10:
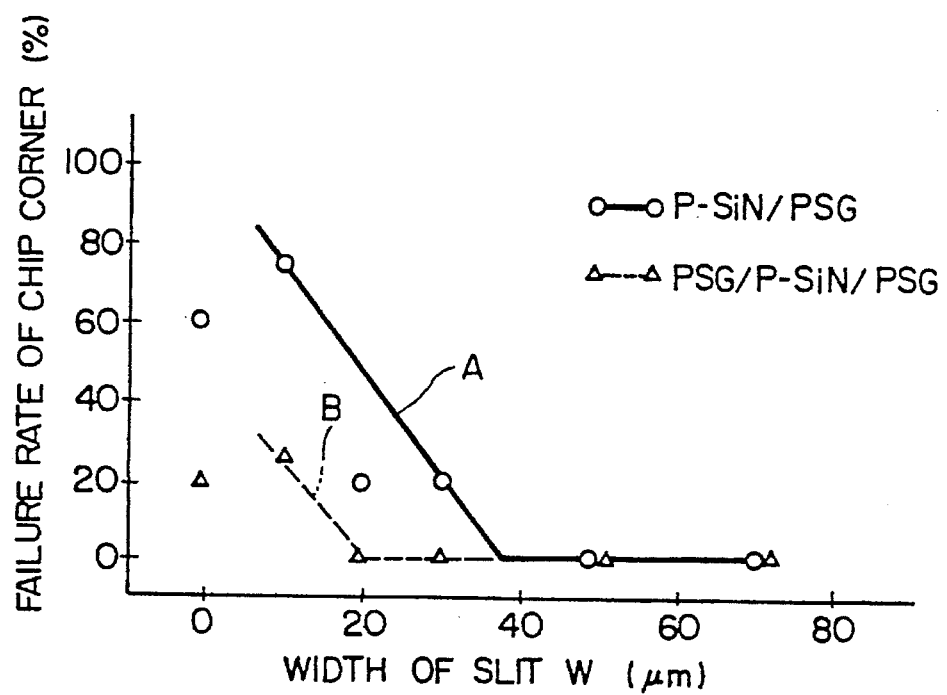
FIG. 10 is a graph showing the relationships between the width of a slit in a guard ring and the failure rate of chip corners, in semiconductor devices embodying this invention.

FIG. 10 is a graph illustrating the fact that the percentage of the occurrence of the cracks of the passivation film corresponding to the guard ring portion in the case of forming the L-shaped slits according to this invention in the corner parts of the guard ring, as shown in FIG. 11, depends upon the width W of the slits. As the passivation films in this case, a curve A corresponds to the two-layer film of P-SiN/PSG=1.1 μm/0.2 μm, and a curve B the three-layer film of PSG/P-SiN/PSG=0.85 μm/1.1 μm/0.2 μm. As understood from FIG. 10, the failure rate of chip corners lowers remarkably at slit widths of 20 μm–40 μm. The conditions of the chip size and the temperature cycles in this case were the same as in the case illustrated in FIG. 8.

FIGS. 13A–13D show further embodiments of this invention. While the figures schematically illustrate various shapes of the corner part of the aluminum guard ring 160 μm wide in a semiconductor device, the remaining construction of the semiconductor device is the same as explained with reference to FIGS. 3–6.

Figure 13A:
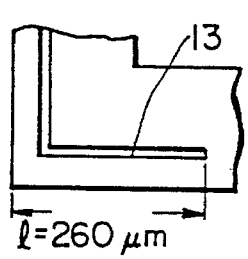
FIGS. 13A–13D are schematic plan views showing various shapes of guard rings at corner parts in order to explain the graph of FIG. 12

The embodiment shown in FIG. 13A corresponds to a case where one elongated slit is formed so that its length λ from the corner of the guard ring may be 260 μm.

Figure 13C:
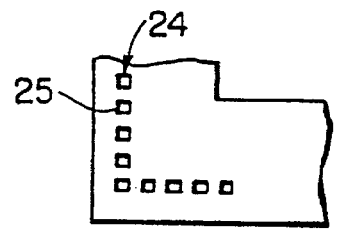
Figure 13B:
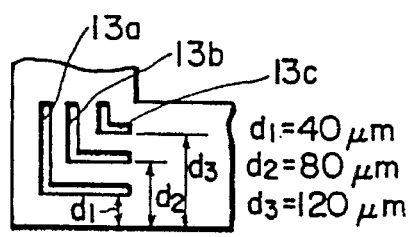

FIG. 13B illustrates a case where three short slits 13a, 13b and 13c, are juxtaposed to one another.

FIG. 13C illustrates a case where small square holes 25, are arrayed in the L-letter shape 24. This embodiment is more advantageous than the case of forming the L-shaped slit in that the increase of the resistance at the corner part of the guard ring can be prevented.

Figure 13D:
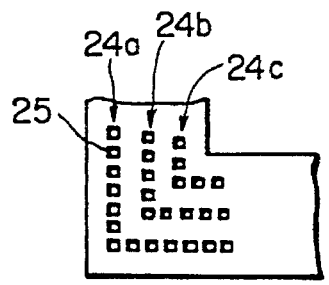

FIG. 13D illustrates a case where small holes 25 are arrayed into three L-shaped rows 24a, 24b and 24c. The size of the hole 25, in this case is made, for example, 10 μm square.

Figure 12:
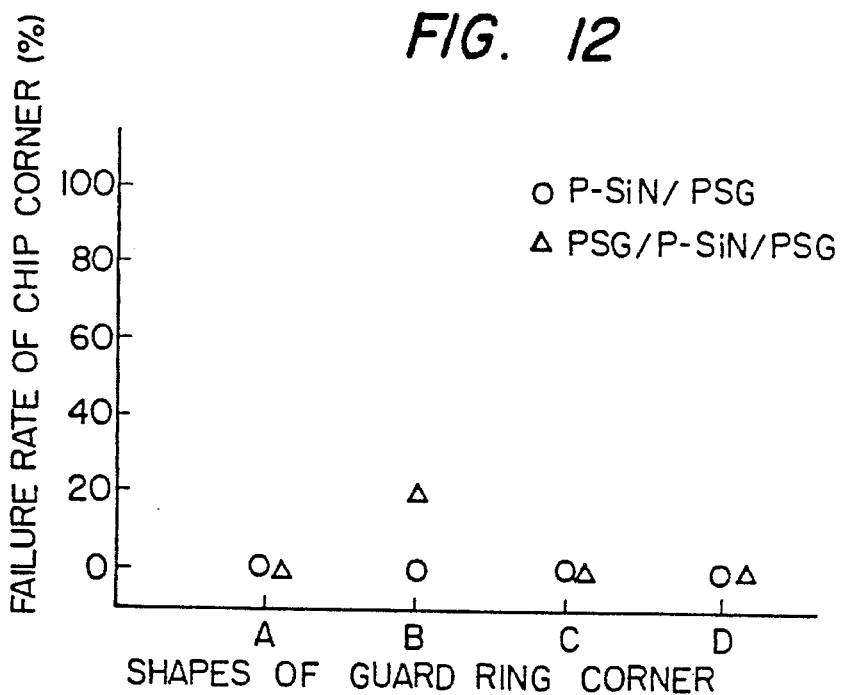
FIG. 12 is a graph showing the relationships between the shape of a guard ring and the failure rate of chip corners, in semiconductor devices according to other embodiments of this invention.

As to the embodiments of FIGS. 13A–13D, the rates of occurrence of the cracks of the final passivation films at the corner parts were studied. The results are shown in FIG. 12. The semiconductor pellets in this case where 4.7×4.7 mm square, and the temperature cycles were temperature changes of from −55° C. to +150° C.; repeated 20 times. Likewise to the case of FIG. 10, the passivation films were of the two-layer structure of P-SiN/PSG and the three-layer structure of PSG/P-SiN/PSG. In FIG. 12, marks O correspond to the cases of employing the passivation films of PSG/P-SiN/PSG, and marks Δ the case of employing the passivation films of PSG/P-SiN/PSG.

As understood from FIG. 12, the failure rates of the chip corners can be lowered by forming the slits and the rows of the holes.

As apparent from the foregoing embodiments, according to the invention, means for reducing the effective width of the guard ring at the corner part, such as the slit and the row of the holes is added to the corner part of the guard ring. Thus, the stress which the molding resin exerts on the passivation films adjoining the guard ring at the corner part can be reduced, so that the passivation films can be prevented from cracking.

This invention is not restricted to only the foregoing embodiments. By way of example, the construction and shape of the passivation film to be formed on the guard ring of aluminum can be properly modified. The shape of the guard ring itself is sometimes modified depending upon the arrangement of the internal circuits or the bonding pads. The resinous sealing member may well include an undercoating resin which is directly applied on the surface of the guard ring portio. While aluminum has been referred to as the material of the guard ring, a different metal film such as molybdenum silicide film may well be used.

Further, this invention is effective for enhancing the moisture resistance when applied to semiconductor devices which have a guard ring and which employ a passivation film lying in contact with wirings and containing a high concentration of phosphorus, especially semiconductor devices such as plastics molded type LSIs.

What is claimed is:

1. A semiconductor integrated circuit device comprising:
   a substantially tetragonal semiconductor substrate having
      a major surface including a first peripheral edge and a
      second peripheral edge adjacent to said first peripheral edge to define a corner of said major surface of said substantially tetragonal semiconductor substrate;

a plurality of active circuit elements which are formed on said major surface of said substantially tetragonal semiconductor substrate;

a plurality of bonding pads formed on said major surface of said substantially tetragonal semiconductor substrate;

a metal wiring electrically connecting one of said plurality of active circuit elements and one of said bonding pads, and a broad metal wiring formed adjacent to said first and second peripheral edges of said major surface of said substantially tetragonal semiconductor substrate, said broad metal wiring including a first portion extending in parallel with said first peripheral edge, a second portion extending in parallel with said second peripheral edge and a connecting portion connecting said first portion with said second portion;

a silicon nitride film formed by plasma process, formed over said metal wiring and said broad metal wiring; and a sealing resin which is formed over said silicon nitride film and which encapsulates said semiconductor substrate, wherein said broad metal wiring having a slit formed in said broad metal wiring in said corner of said semiconductor substrate, and said broad metal wiring having side wall defining said slit, said silicon nitride film covering said side wall of said broad metal wiring, and said broad metal wiring being sufficient to act as wiring for supplying a power source or a ground potential for said plurality of active circuit elements.

2. A semiconductor integrated circuit device according to claim 1, wherein said slit is formed in said connecting portion of said broad metal wiring.

3. A semiconductor integrated circuit device according to claim 2, wherein said slit extends from said connecting portion to said first portion of said broad metal wiring.

4. A semiconductor integrated circuit device according to claim 3, wherein said slit extends from said connecting portion to said second portion of said broad metal wiring.

5. A semiconductor integrated circuit device according to claim 1, wherein said metal wiring and broad metal wiring comprise an aluminum film.

6. A semiconductor integrated circuit device according to claim 5, further comprising an insulating film formed under said aluminum film and said silicon nitride film covers a portion of said insulating film exposed by said slit.

7. A semiconductor integrated circuit device according to claim 6, wherein said insulating film comprises a phosphosilicate glass.

* * * * *